US012683116B2

(12) United States Patent
Voigt et al.

(10) Patent No.: US 12,683,116 B2
(45) Date of Patent: Jul. 14, 2026

(54) METHODS AND SYSTEMS FOR TOMOGRAPHIC MICROSCOPY IMAGING

(71) Applicant: FEI Company, Hillsboro, OR (US)

(72) Inventors: Andreas Voigt, Eindhoven (NL); Trond Varslot, Vuku (NO); Magda Zaoralová, Menlo Park, CA (US)

(73) Assignee: FEI Company, Hillsboro, OR (US)

( * ) Notice: Subject to any disclaimer, the term of this patent is extended or adjusted under 35 U.S.C. 154(b) by 583 days.

(21) Appl. No.: 18/090,100

(22) Filed: Dec. 28, 2022

(65) Prior Publication Data

US 2023/0215687 A1     Jul. 6, 2023

(30) Foreign Application Priority Data

Dec. 30, 2021    (EP) ..................................... 21218280
Dec. 22, 2022    (EP) ..................................... 22216114

(51) Int. Cl.
*H01J 37/26*          (2006.01)
*G01B 15/04*         (2006.01)
*G01N 23/046*        (2018.01)
*G06T 7/73*          (2017.01)

(52) U.S. Cl.
CPC ............ *H01J 37/261* (2013.01); *G01B 15/04* (2013.01); *G06T 7/75* (2017.01); *G06T 2207/10056* (2013.01); *G06T 2207/10072* (2013.01)

(58) Field of Classification Search
CPC .. H01J 37/261; H01J 2237/226; G01B 15/04; G06T 7/75; G06T 2207/10056; G06T 2207/10072; G01N 23/225; G01N 23/046
See application file for complete search history.

(56) References Cited

U.S. PATENT DOCUMENTS

| | | | | |
|---|---|---|---|---|
| 7,064,326 B2 * | 6/2006 | Furukawa | ............... | H01J 37/26 |
| | | | | 250/311 |
| 7,974,379 B1 | 7/2011 | Case et al. | | |
| 8,779,357 B1 * | 7/2014 | Miller | ................... | G01B 15/00 |
| | | | | 250/397 |

(Continued)

FOREIGN PATENT DOCUMENTS

| | | |
|---|---|---|
| EP | 3657528 A1 | 5/2020 |
| WO | WO-2011085448 A1 | 7/2011 |
| WO | WO-2020191121 A1 | 9/2020 |

OTHER PUBLICATIONS

EP22216114.3, Extended European Search Report, May 2, 2023, 9 pages.

(Continued)

*Primary Examiner* — Amandeep Saini
*Assistant Examiner* — Emma Rose Goebel

(57)          ABSTRACT

The present invention relates to a method for acquiring tomographic images of a sample in a microscopy system, wherein the sample comprises a defined region, and wherein the method comprises determining a location in three-dimensional space of the defined region, wherein the method further comprises capturing an image of at least a part of the sample, and wherein the determination of the location in three-dimensional space of the defined region is based, at least in part, on the image of the part of the sample. The present invention also relates to a corresponding microscopy system and a computer program product to perform the method according to the present invention.

16 Claims, 4 Drawing Sheets

(56)    References Cited

U.S. PATENT DOCUMENTS

| | | | |
|---|---|---|---|
| 11,574,794 B2 | 2/2023 | Varslot et al. | |
| 12,056,894 B2 * | 8/2024 | Case | G06T 7/74 |
| 2013/0175446 A1 * | 7/2013 | Nakatani | G01N 1/28 |
| | | | 250/310 |
| 2019/0122435 A1 * | 4/2019 | Prideaux-Ghee | G06T 15/20 |
| 2019/0277779 A1 * | 9/2019 | Wuestenbecker | G01T 1/2914 |
| 2021/0241522 A1 * | 8/2021 | Guler | G06T 19/20 |

OTHER PUBLICATIONS

Owen C.H., et al., "Alignment of Electron Tomographic Series by Correlation without the use of Gold Particles," Ultramicroscopy, Apr. 1996, vol. 63, No. 1, XP022354696, pp. 27-38.
Penczek P., et al., "Double-Tilt Electron Tomography," Ultramicroscopy, Oct. 1995, vol. 60, No. 3, XP027305939, pp. 393-410.
Bouvette J, et al. Beam Image-Shift Accelerated Data Acquisition for Near-Atomic Resolution Single-Particle Cryo-Electron Tomography, Nature Communications, Mar. 30, 2021, vol. 12, No. 1, 11 pages.

* cited by examiner

METHODS AND SYSTEMS FOR TOMOGRAPHIC MICROSCOPY IMAGING

FIELD

The present invention relates generally to the field of microscopy. More particularly, it relates to a method and system for acquiring tomographic images efficiently using a charged particle beam microscope.

BACKGROUND

Charged particle beam microscopes employ a charged particle beam, such as an electron or ion beam, for imaging and/or fabricating samples. They offer improved resolution with respect to optical microscopes owing to the shorter wavelength of charged particles. They are thus widely used for imaging and observation of microscopic or nanoscopic samples. Typically, however, the samples used in charged particle beam microscopy comprise substantially 2-dimensional samples, i.e., an extension of the sample in one dimension is substantially lesser than its extension in any of the other 2 dimensions. However, owing to their higher resolution, charged particle beams are also sought to be employed for imaging and observation of 3-dimensional samples. These studies may employ a tomographic mode of imaging for the sample in which the charged particle beam may illuminate the sample as the sample is tilted by different angles and images obtained for each of the tilt angles.

A relevant consideration for carrying out tomographic imaging using the method described above may be misalignment of the sample with a sample holder or imperfections in the sample fabrication process. The sample is typically placed on a sample holder that may be configured, via a stage, to be rotated along an axis thus causing a change in a tilt angle of the sample. As the sample is tilted, a particular feature on the sample may be tracked in the images to allow exposing that same feature at different angles allowing for tomographic imaging of the feature.

The placing (or positioning) of the sample on the sample holder may be carried out so as to align an axis of the sample (about which the sample may be tilted to acquire tomographic images) with the tilt axis of the stage. However, any misalignment between the axis of the sample and the tilt axis of the stage may result in a precession of the image of the feature in the sample. Alternatively, if there are imperfections in the sample preparation process, for example, the sample, and in particular the tracked feature on the sample, may not be aligned correctly within the sample holder, thus causing precession of the image of the tracked feature in the sample.

As a result of the precession of the tracked feature in the image of the sample, the tracked feature may move out of the field of view of a camera of the imaging system. Then, the feature may have to be tracked again to bring it into the field of view and a new image may have to be captured. This may lead to a decreased efficiency of the imaging process. In addition, some samples may be sensitive to the dose of radiation. This may be the case, for example, with cryogenic/cooled samples. In such cases, the illumination of a part of the sample prior to tracking the feature (once it has left the field of view thus furnishing the information that the tracked feature has left the field of view) may lead to its degradation rendering it unfit for imaging (and further analysis) later on. Thus, a significant amount of space on the sample that may be used for imaging, and thus extracting information, may be used up. This may also lead to a reduction in the throughput of the imaging process.

Embodiments of the present technology aim to improve the efficiency of microscopy systems by improving the efficiency of tomographic image acquisition. They may allow acquisition of data from multiple regions on the same sample, including dose-sensitive samples. They may be of particular relevance for microscopy systems used for studies of significantly 3-dimensional samples or for 2-dimensional samples with a non-zero extension in a third dimension.

The present invention seeks to overcome or at least alleviate the shortcomings and disadvantages of the prior art. More particularly, it is an object of the present invention to provide an improved system and method for improving the efficiency of tomographic imaging by determining a three-dimensional location of a defined region prior to imaging and, based thereon, to carry out imaging.

SUMMARY

According to a first aspect, the present invention relates to a method for acquiring tomographic images of a sample in a microscopy system, wherein the sample comprises a defined region, and wherein the method comprises determining a location in three-dimensional space of the defined region.

The defined region may comprise an exposure region that comprises features that may be of interest for imaging. The defined region may also comprise a focusing region that may be interest for focusing an imaging system of the microscopy system on. Further, the defined region may also comprise a tracking region that may comprise features that may be used for tracking the sample and that may be imaged at a high magnification, for example. Determining the location of the defined region may comprise determining the three-dimensional position of at least one point comprised by the defined region. Once the three-dimensional location of the defined region has been determined, it may be imaged at an appropriate magnification, or brought into focus using the imaging system as described further below.

The method may further comprise capturing an image of at least a part of the sample. The part of the sample may or may not comprise the defined region described above. Preferably, it may comprise the defined region as described above. Further, whenever "part of the sample" is used in the following, it is to be understood to be the part of the sample imaged as described above.

The part of the sample may comprise the whole sample. In other words, the whole sample may be imaged. As may be appreciated, this may comprise choosing an appropriate magnification of a beam used for imaging.

The image as described above may be captured at a first magnification.

The determination of the location in three-dimensional space of the defined region may be based, at least in part, on the image of the part of the sample.

The sample may comprise a feature. The feature may comprise zero extension, such as a point, or it may comprise a non-zero extension, such as an edge. For example, the sample may comprise a rod-like section and the feature may comprise, for example, a position on the rod-like section. Or, the sample may comprise a significantly planar section and the feature may comprise an edge of the planar section. Further the feature may comprise a position in the sample on which the image may be centered.

The sample may comprise a plurality of features. For example, the plurality of features may comprise two edges in the image of the planar section of a planar sample. Or, the plurality of features may comprise a feature on which the image may be centered and a position on the image of the rod-like section, for example, in case the sample comprises a rod-like section.

The sample may comprise a first feature and a second feature. Any of the first feature and the second feature may comprise a feature as defined above, viz., it may comprise zero extension, such as a point, or it may comprise a non-zero extension, such as an edge. For example, the sample may comprise a rod-like section and the first feature may comprise, for example, a position on the rod-like section and the second feature may comprise another position on the rod-like section. Or, the sample may comprise a significantly planar section and the first feature may comprise one edge of the planar section and the second feature may comprise another edge of the planar section. The first feature may also comprise, for example, a point-like feature, whereas the second feature may comprise a feature with a non-zero extension. It may be understood that the features described here are merely exemplary and should not be considered to be an exhaustive listing of what may comprise a feature.

The method may further comprise determining a configuration in three-dimensional space of the feature of the sample. The terms "configuration" and "relative configuration" here and in the following are intended to comprise position and/or orientation. That is, in particular, they may comprise either position or orientation or both. As may be appreciated, depending on the feature only one of the above may apply. For example, for a point-like feature the configuration may comprise only a position, whereas for a vector or an edge it may comprise any of a position (defined by the co-ordinates of a point through which the edge or the vector passes, for example) or an orientation (defined by the direction cosines of the edge or the vector, for example). Thus, determining the configuration in three-dimensional space may comprise determining co-ordinates of the feature with respect to some co-ordinate system in case the feature comprises a point-like feature. Alternatively, in case the feature comprises an extended feature such as an edge, for example, determining the configuration may comprise, determining the co-ordinates of a point through which the edge passes and/or direction cosines of the edge in three-dimensional space. Note that determining the configuration may also comprise using only any one of the co-ordinates of a point through which the edge passes or the direction cosines of the edge in three-dimensional space. Thus, it may be understood that determining the configuration comprises determining any information necessary to specify the three-dimensional position and/or orientation of the feature. The configuration in three-dimensional space may not have to be determined with perfect accuracy. As is described further below, embodiments of the present technology are based on the relative configuration and so if all of the configurations are offset by the same amount, the relative configuration remains unchanged.

The method may further comprise determining the configurations in three-dimensional space of any of the plurality of features.

The method may comprise determining the configuration of the first feature in three-dimensional space relative to the configuration of the second feature in three-dimensional space. For example, in case the first feature and the second feature each comprise an edge, determining their relative configurations may comprise determining an angle between them in three-dimensional space and/or the co-ordinates in three-dimensional space of an intersection point of the two edges. The intersection point may correspond to a corner of the sample.

The method as described above may comprise determining a projection of the first feature on the image plane based, at least in part, on the configuration of the first feature in three-dimensional space, and a projection of the second feature on the image plane based on the configuration of the second feature in three-dimensional space, wherein the projections on the image plane lie in a projection space, and wherein the method further comprises determining the configuration of the first feature in the projection space relative to the configuration of the second feature in the projection space. The projection may also be based on any of a position of an imaging beam, a beam magnification, or any other appropriate factor. Determining the configuration in the projection space may comprise determining co-ordinates of the feature with respect to a co-ordinate system of the projection space. Alternatively, in case the feature comprises an extended feature such as an edge, for example, determining the configuration may comprise, determining the co-ordinates of a point through which the edge passes and/or direction cosines of the edge in the projection space.

The part of the sample as described above may comprise a feature.

The part of the sample may comprise a plurality of features.

The part of the sample may comprise a first feature and a second feature.

The method may comprise identifying the feature in the image of the part of the sample.

The method may comprise identifying the plurality of features in the image of the part of the sample.

The method may further comprise determining a configuration in the image of the feature of the part of the sample. Determining the configuration in the image may thus comprise determining co-ordinates of the feature in pixel space of the image in case the feature comprises a point-like feature. Alternatively, in case the feature comprises an extended feature such as an edge, for example, determining the configuration may comprise, determining the pixel co-ordinates of a point through which the edge passes and/or direction cosines of the edge in pixel space. Note that determining the configuration may also comprise using only one of the pixel co-ordinates of a point through which the edge passes or the direction cosines of the edge in pixel space.

The method may comprise determining the configuration of the first feature in the image of the part of the sample relative to the configuration of the second feature in the image of the part of the sample. The configuration of the first feature relative to the configuration of the second feature (or vice versa) may also be called a relative configuration of the first feature and the second feature. Determining the relative configuration of the first and second features in the image may comprise determining a distance and/or direction in the plane of the image between the first and second features in case each of the features comprises a point-like feature. Or, in case each of the features comprises, for example, an edge, as described above, the relative configuration in the image may comprise an angle between the edges as seen in the image of the part of the sample.

The method may comprise comparing the relative configuration of the first feature and the second feature in the image of the part of the sample to the relative configuration of the first feature and the second feature in the projection space.

The determination of the location in three-dimensional space of the defined region may be based, at least in part, on the comparison of the relative configuration of the first feature and the second feature in the image of the part of the sample to the relative configuration of the first feature and the second feature in the projection space. That is, the determination of the location in three-dimensional space of the defined region may be based, for example, on the projection of a three-dimensional vector connecting points belonging to the sample and its comparison to an image of a three-dimensional vector substantially parallel to it. In other words, knowing the three-dimensional vector connecting two points on the sample (or possibly just its orientation), in particular its projection on to an image plane, and the image of the three-dimensional vector (or of a vector substantially parallel to the three-dimensional vector), the position/orientation of the sample may be determined from which the location of the defined region may be determined. Or, knowing the three-dimensional orientation and/or position of two edges belonging to the sample and their projection on to a plane, the position/orientation of the sample may be determined from which the location of the defined region may be determined. Note that the determination of the location in three-dimensional space of the defined region is only based on relative configurations in the projection space. Consequently, the configuration of the individual features in three-dimensional space may not have to be accurate so long as the relative configuration between features is accurate. In particular, for example, the exact position and/or orientation of the sample, and thus of any of the features in the sample, in three-dimensional space may not be known. However, the relative positions and/or orientations of the features may still be determined accurately since the configuration of each of the features is inaccurate by the same amount.

The method may further comprise generating a model of at least a part, that may be called a modeled part, of the sample. The model of the modeled part of the sample may be understood to be a geometric representation of the modeled part of the sample. In other words, it may comprise the various features of the modeled part of the sample positioned in accordance with their relative positions on the sample.

The modeled part may comprise the whole sample.

The model may be based on a geometry of the sample. Thus, for example, the sample may comprise a rod-like sample and the model for such a sample may comprise a cylindrical section with a width and a length corresponding to the rod-like sample. Or, the sample may comprise a significantly planar, rectangular sample and the model for such a sample may comprise a rectangle with a length and a width corresponding to the sample. The modeled part of the sample, together with the geometry of the sample, may then be used to determine the three-dimensional location of any point on the sample.

The method may comprise determining a projection of at least a part, that may be called a projected part, of the sample. The projection may be based, at least in part, on the model described above. The modeled part and the projected part of the sample may or may not be identical parts of the sample. Based on the modeled part, together with the geometry and other characteristics (rigidity, for example) of the sample, for example, it may be possible to determine the projection of the projected part (that may be different). In particular, it may thus not be necessary to generate a model for the whole sample.

The method may comprise capturing an image of the projected part of the sample. Note that the projection and the image of the projected part may not be identical. In particular, the projection may be understood to represent an expected image of the projected part of the sample based on its position/orientation under an imaging beam and on the assumed geometry of the projected part.

The method may comprise comparing the image and the projection of the projected part of the sample.

The method may further comprise refining the model based on the comparison between the image and the projection of the projected part of the sample. That is, the model may be first used to determine a projection of the projected part of the sample followed by capturing an image of the projected part of the sample. The projection may be compared to the image of the projected part of the sample and any differences that may be found may be used to update the model of the modeled part of the sample (that is used to derive the projection of the projected part of the sample). In other words, the image may be used for feedback into the process of generating the model and, thus, determining the location in three-dimensional space of the defined region as described below.

The determination of the location in three-dimensional space of the defined region may be based, at least in part, on the model.

The method may comprise capturing the image as described above at a plurality of sample orientations. The sample orientation in three-dimensional space may be defined generally using any of the various methods to describe the orientation of a rigid body such as Euler angles, Tait-Bryan angles, etc. with respect to a defined co-ordinate system.

The method may comprise capturing the image of at least a part of the sample at a first sample orientation.

The image of the part of the sample as described above may comprise the image of the part of the sample at the first sample orientation. That is, the part of the sample may comprise a plurality of features, such as two features, that are identified in an image of the part of the sample at the first sample orientation.

The method may comprise capturing the image of at least a part of the sample at a second sample orientation, wherein the second sample orientation is not identical to the first sample orientation.

The image of the part of the sample as described above may comprise the image of the part of the sample at the second sample orientation. That is, the part of the sample may comprise a plurality of features, such as two features, that are identified in an image of the part of the sample at the second sample orientation. Note that any of the two features identified in the image of the part of the sample at the second sample orientation may or may not be identical to any of the two features identified in the image of the part of the sample at the first sample orientation.

The determination of the location in three-dimensional space of the defined region may be based, at least in part, on the relative configuration of the first feature and the second feature in the image of the part of the sample at the first sample orientation and on the relative configuration of the first feature and the second feature in the image of the part of the sample at the second sample orientation.

The model of the modeled part of the sample as described above may be based, at least in part, on the relative configuration of the first feature and the second feature in the image of the part of the sample at the first sample orientation and on the relative configuration of the first feature and the second feature in the image of the part of the sample at the second sample orientation.

The microscopy system may comprise a stage comprising a stage tilt axis and configured to position and/or orient the sample, and the method may comprise rotating the sample about the stage tilt axis to vary a tilt angle of the stage and change the orientation of the sample.

The determination of the location in three-dimensional space of the defined region may be based, at least in part, on the tilt angle of the stage.

The method may further comprise positioning the sample within the stage.

Positioning the sample within the stage may comprise substantially aligning an axis of the sample with the stage tilt axis.

A result of positioning the sample within the stage may be a misalignment of the axis of the sample with the stage tilt axis. In other words, the sample may not be perfectly aligned to the stage and thus the position of the defined region may not be accurately determined.

The first sample orientation as described above may comprise a first tilt angle, the second sample orientation as described above may comprise a second tilt angle, and a difference between the first tilt angle and the second tilt angle may be greater than 0° and less than or equal to 90°, preferably between 10° and 80°, further preferably between 30° and 60°.

Each of the first tilt angle, and the second tilt angle, may be between −180° and +180°, preferably between −90° and +90°, further preferably between −70° and +70°.

The defined region may comprise an exposure region configured to be imaged at an imaging magnification.

The imaging magnification may be greater than or equal to the first magnification.

The method may comprise illuminating at least a part of the sample with a beam of particles.

The method may comprise positioning the beam of particles over the exposure region based on the determined location in three-dimensional space of the exposure region.

The method may comprise positioning the exposure region of the sample under the beam of particles.

The defined region may comprise a focusing region.

The microscopy system may comprise an imaging system, and the method may comprise focusing the imaging system onto the focusing region. For example, a sample may comprise a focus region as well as an exposure region and they may be displaced with respect to each other such that they are at different heights. Then, the method as described above may be used to determine the location of the focus region as well as the location of the exposure region and, based thereon, to focus the imaging system on to the focus region and the imaging beam on to the exposure region.

The defined region may comprise a tracking region configured to be imaged at a tracking magnification.

The tracking magnification may be greater than the first magnification.

The sample may comprise a plurality of defined regions, and the method may comprise determining the location in three-dimensional space of each of the plurality of defined regions.

The method may comprise determining the location in three-dimensional space of a first of the plurality of defined regions, and based thereon, determining the location in three-dimensional space of a second of the plurality of defined locations.

The method may comprise directing a beam of particles at, at least, a part of the sample.

The microscopy system may comprise a source of particles.

The determination of the location in three-dimensional space of the defined region may be based on the position of the source of particles.

According to a second aspect, the present invention relates to a microscopy system configured for acquiring tomographic images of a sample, wherein the sample comprises a defined region, and wherein the microscopy system is configured to determine a location in three-dimensional space of the defined region.

The microscopy system may be configured to illuminate at least a part of the sample by directing a beam of particles at the part of the sample.

The microscopy system may comprise a stage configured to hold the sample and to position and/or orient the sample.

The microscopy system may comprise a data processing unit.

The microscopy system may comprise an imaging system configured to capture an image of at least a part of the sample.

The microscopy system may be configured to determine the location in three-dimensional space of the defined region based on the image of the part of the sample.

The imaging system may be configured to detect emissions resulting from an interaction of the part of the sample with the beam of particles.

The imaging system may comprise a detector.

The imaging system may comprise a camera.

The microscopy system may be configured to focus the imaging system over at least a part of the sample.

The microscopy system may comprise a control unit configured to position at least a part of the sample under the beam of particles.

The microscopy system may comprise an electro-optic system configured to position the beam of particles over at least a part of the sample.

The control unit may be configured to control the electro-optic system.

The data processing unit may be configured to communicate with the imaging system.

The data processing unit may be configured to communicate with the control unit.

The data processing unit may be configured to receive a geometry of the sample.

The data processing unit may be configured to determine a projection of at least a part, that may be called a projected part, of the sample.

The data processing unit may be further configured to determine the projection of the projected part of the sample based on the geometry of the sample.

The microscopy system may comprise a source of particles and the data processing unit may be configured to receive a distance between the source of particles and a point in the projected part of the sample and, based thereon, to determine the projection of the projected part of the sample.

The stage may comprise a tilt axis.

The microscopy system may be configured to allow varying a tilt angle of the stage by rotating the sample about the tilt axis.

The data processing unit may be configured to receive the tilt angle of the stage and, based thereon, to determine the location in three-dimensional space of the defined region.

The sample may be configured to be positioned inside the stage.

Positioning the sample inside the stage may comprise substantially aligning an axis of the sample with the tilt axis of the stage.

The data processing unit may be further configured to receive an angle between the axis of the sample and the tilt axis of the stage and, based thereon, to determine the location in three-dimensional space of the defined region.

The data processing unit may be configured to send data relating to the location of the defined region to the control unit.

The microscopy system may comprise a user interface configured to at least accept an input.

The data processing unit may be configured to communicate with the user interface.

The part of the sample may comprise a feature, and the microscopy system may be configured to identify the feature in the image of the part of the sample.

The data processing unit may be configured to determine a configuration of the feature in the image of the part of the sample based on an input to the user interface.

The data processing unit may be configured to determine a configuration of the feature in the image of the part of the sample based on an artificial intelligence-based model.

The artificial intelligence-based model may comprise a supervised learning model.

An input to the artificial intelligence-based model may comprise an image of the part of the sample.

An output of the artificial intelligence-based model may comprise the configuration of the feature in the image of the part of the sample.

The supervised learning model may be trained on a dataset comprising the image of the part of the sample and the configuration of the feature.

The data processing unit may be configured to determine the configuration of the feature in the image of the part of the sample using any of edge detection, filtering, feature detection, ridge detection, or any other image processing method.

The sample may comprise a feature.

The microscopy system may be configured to determine the configuration of the feature as described above in three-dimensional space.

The data processing unit may be configured to generate a model of at least a part, that may be called a modeled part, of the sample.

The microscopy system may be configured to perform the method according to any of the preceding method embodiments.

According to a third aspect, the present invention relates to a computer program product comprising instructions, when run on a data processing unit of a microscopy system, to perform the method according to any of the preceding method embodiments.

Below method embodiments will be discussed. These are abbreviated by the letter 'M' followed by a number. Whenever reference is herein made to method embodiments, these embodiments are meant.

M1. A method for acquiring tomographic images of a sample in a microscopy system, wherein the sample comprises a defined region, and wherein the method comprises determining a location in three-dimensional space of the defined region.

M2. The method according to the preceding embodiment, wherein the method further comprises capturing an image of at least a part of the sample.

M3. The method according to the preceding embodiment, wherein the part of the sample comprises the whole sample.

M4. The method according to any of the 2 preceding embodiments, wherein the image is captured at a first magnification.

M5. The method according to any of the 3 preceding embodiments, wherein the determination of the location in three-dimensional space of the defined region is based, at least in part, on the image of the part of the sample.

M6. The method according to any of the preceding method embodiments, wherein the sample comprises a feature.

M7. The method according to any of the preceding method embodiments and with the features of embodiment M6, wherein the sample comprises a plurality of features.

M8. The method according to the preceding embodiment, wherein the sample comprises a first feature and a second feature.

M9. The method according to any of the preceding method embodiments and with the features of embodiment M6, wherein the method further comprises determining a configuration in three-dimensional space of the feature of the sample.

M10. The method according to the preceding embodiment and with the features of embodiment M7, wherein the method further comprises determining the configurations in three-dimensional space of any of the plurality of features.

M11. The method according to any of the preceding method embodiments and with the features of embodiment M8, wherein the method comprises determining the configuration of the first feature in three-dimensional space relative to the configuration of the second feature in three-dimensional space.

M12. The method according to the preceding embodiment and with the features of embodiment M2, wherein the method comprises determining a projection of the first feature on the image plane based, at least in part, on the configuration of the first feature in three-dimensional space, and a projection of the second feature on the image plane based on the configuration of the second feature in three-dimensional space, wherein the projections on the image plane lie in a projection space, and wherein the method further comprises determining the configuration of the first feature in the projection space relative to the configuration of the second feature in the projection space.

M13. The method according to any of the preceding method embodiments and with the features of embodiment M2, wherein the part of the sample comprises a feature.

M14. The method according to the preceding embodiment, wherein the part of the sample comprises a plurality of features.

M15. The method according to the preceding embodiment, wherein the part of the sample comprises a first feature and a second feature.

M16. The method according to any of the preceding method embodiments and with the features of embodiment M13, wherein the method comprises identifying the feature in the image of the part of the sample.

M17. The method according to the preceding embodiment and with the features of embodiment M14, wherein the method comprises identifying the plurality of features in the image of the part of the sample.

M18. The method according to any of the preceding method embodiments and with the features of embodiment M16, wherein the method further comprises determining a configuration in the image of the feature of the part of the sample.

M19. The method according to the preceding embodiment and with the features of embodiment M15, wherein the method comprises determining the configuration of the first feature in the image of the part of the sample relative to the configuration of the second feature in the image of the part of the sample.

M20. The method according to the preceding embodiment and with the features of embodiment M12, wherein the method comprises comparing the relative configuration of the first feature and the second feature in the image of the part of the sample to the relative configuration of the first feature and the second feature in the projection space.

M21. The method according to the preceding embodiment, wherein the determination of the location in three-dimensional space of the defined region is based, at least in part, on the comparison of the relative configuration of the first feature and the second feature in the image of the part of the sample to the relative configuration of the first feature and the second feature in the projection space.

M22. The method according to any of the preceding method embodiments, wherein the method further comprises generating a model of at least a part, that may be called a modeled part, of the sample.

M23. The method according to the preceding embodiment, wherein the modeled part comprises the whole sample.

M24. The method according to any of the 2 preceding embodiments, wherein the model is based on a geometry of the sample.

M25. The method according to any of the preceding method embodiments, wherein the method comprises determining a projection of at least a part, that may be called a projected part, of the sample.

M26. The method according to the preceding embodiment and with the features of embodiment M22, wherein the projection is based, at least in part, on the model.

M27. The method according to any of the 2 preceding embodiments and with the features of embodiment M2, wherein the method comprises capturing an image of the projected part of the sample.

M28. The method according to the preceding embodiment and with the features of embodiment M26, wherein the method comprises comparing the image and the projection of the projected part of the sample.

M29. The method according to the preceding embodiment and with the features of embodiment M22, wherein the method further comprises refining the model based on the comparison between the image and the projection of the projected part of the sample.

M30. The method according to any of the preceding embodiments and with the features of embodiment M22, wherein the determination of the location in three-dimensional space of the defined feature is based, at least in part, on the model.

Stereographic Analysis

M31. The method according to any of the preceding method embodiments and with the features of embodiment M2, wherein the method comprises capturing the image at a plurality of sample orientations.

M32. The method according to the preceding embodiment, wherein the method comprises capturing the image of at least a part of the sample at a first sample orientation.

M33. The method according to the preceding embodiment and with the features of embodiment M19, wherein the image of the part of the sample comprises the image of the part of the sample at the first sample orientation.

M34. The method according to any of the 2 preceding embodiments, wherein the method comprises capturing the image of at least a part of the sample at a second sample orientation, wherein the second sample orientation is not identical to the first sample orientation.

M35. The method according to the preceding embodiment and with the features of embodiment M19, wherein the image of the part of the sample comprises the image of the part of the sample at the second sample orientation.

M36. The method according to the preceding embodiment and with the features of embodiment M33, wherein the determination of the location in three-dimensional space of the defined region is based, at least in part, on the relative configuration of the first feature and the second feature in the image of the part of the sample at the first sample orientation and on the relative configuration of the first feature and the second feature in the image of the part of the sample at the second sample orientation.

M37. The method according to any of the preceding method embodiments and with the features of embodiments M22, M33, and M35, wherein the model of the modeled part of the sample is based, at least in part, on the relative configuration of the first feature and the second feature in the image of the part of the sample at the first sample orientation and on the relative configuration of the first feature and the second feature in the image of the part of the sample at the second sample orientation.

M38. The method according to any of the preceding method embodiments, wherein the microscopy system comprises a stage comprising a stage tilt axis and configured to position and/or orient the sample, and wherein the method comprises rotating the sample about the stage tilt axis to vary a tilt angle of the stage and change the orientation of the sample.

M39. The method according to preceding embodiment, wherein the determination of the location in three-dimensional space of the defined region is based, at least in part, on the tilt angle of the stage.

M40. The method according to any of the preceding method embodiments and with the features of embodiment M38, wherein the method further comprises positioning the sample within the stage.

M41. The method according to the preceding embodiment, wherein positioning the sample within the stage comprises substantially aligning an axis of the sample with the stage tilt axis.

M42. The method according to the preceding embodiment, wherein a result of positioning the sample within the stage is a misalignment of the axis of the sample with the stage tilt axis.

M43. The method according to any of the preceding method embodiments and with the features of embodiments M34, and M38, wherein the first sample orientation comprises a first tilt angle, the second sample orientation comprises a second tilt angle, and wherein a difference between the first tilt angle and the second tilt angle is greater than 0° and less than or equal to 90°, preferably between 10° and 80°, further preferably between 30° and 60°.

M44. The method according to the preceding embodiment, wherein each of the first tilt angle, and the second tilt angle, is between −180° and +180°, preferably between −90° and +90°, further preferably between −70° and +70°.

M45. The method according to any of the preceding method embodiments, wherein the defined region comprises an exposure region configured to be imaged at an imaging magnification.

M46. The method according to any of the preceding method embodiments, wherein the method comprises illuminating at least a part of the sample with a beam of particles.

M47. The method according to the preceding embodiment and with the features of embodiment M4, wherein the imaging magnification is greater than or equal to the first magnification.

M48. The method according to any of the 2 preceding embodiments, wherein the method comprises positioning the beam of particles over the exposure region based on the determined location in three-dimensional space of the exposure region.

M49. The method according to any of the 3 preceding embodiments, wherein the method comprises positioning the exposure region of the sample under the beam of particles.

M50. The method according to any of the preceding method embodiments, wherein the defined region comprises a focusing region.

M51. The method according to the preceding embodiment, wherein the microscopy system comprises an imaging system, and wherein the method comprises focusing the imaging system onto the focusing region.

M52. The method according to any of the preceding method embodiments, wherein the defined region comprises a tracking region configured to be imaged at a tracking magnification.

M53. The method according to the preceding embodiment and with the features of embodiment M4, wherein the tracking magnification is greater than the first magnification.

M54. The method according to any of the preceding method embodiments, wherein the sample comprises a plurality of defined regions, and wherein the method comprises determining the location in three-dimensional space of each of the plurality of defined regions.

M55. The method according to the preceding embodiment, wherein the method comprises determining the location in three-dimensional space of a first of the plurality of defined regions, and based thereon, determining the location in three-dimensional space of a second of the plurality of defined locations.

M56. The method according to any of the preceding method embodiments, wherein the method comprises directing a beam of particles at, at least, a part of the sample.

M57. The method according to the preceding embodiment, wherein the microscopy system comprises a source of particles.

M58. The method according to the preceding embodiment, wherein the determination of the location in three-dimensional space of the defined region is based on the position of the source of particles.

Below system embodiments will be discussed. These are abbreviated by the letter 'S' followed by a number. Whenever reference is herein made to system embodiments, these embodiments are meant.

S1. A microscopy system configured for acquiring tomographic images of a sample, wherein the sample comprises a defined region, and wherein the microscopy system is configured to a. determine a location in three-dimensional space of the defined region.

S2. The microscopy system according to the preceding embodiment, wherein the microscopy system is configured to illuminate at least a part of the sample by directing a beam of particles at the part of the sample.

S3. The microscopy system according to any of the preceding system embodiments, wherein the microscopy system comprises a stage configured to hold the sample and to position and/or orient the sample.

S4. The microscopy system according to any of the preceding system embodiments, wherein the microscopy system comprises a data processing unit.

S5. The microscopy system according to any of the preceding system embodiments, wherein the microscopy system comprises an imaging system configured to capture an image of at least a part of the sample.

S6. The microscopy system according to the preceding embodiment, wherein the microscopy system is configured to determine the location in three-dimensional space of the defined region based on the image of the part of the sample.

S7. The microscopy system according to the preceding embodiment and with the features of embodiment S2, wherein the imaging system is configured to detect emissions resulting from an interaction of the part of the sample with the beam of particles.

S8. The microscopy system according to any of the 3 preceding embodiments, wherein the imaging system comprises a detector.

S9. The microscopy system according to any of the 4 preceding embodiments, wherein the imaging system comprises a camera.

S10. The microscopy system according to any of the preceding system embodiments and with the features of embodiment S6, wherein the microscopy system is configured to focus the imaging system over at least a part of the sample.

S11. The microscopy system according to any of the preceding system embodiments and with the features of embodiment S2, wherein the microscopy system comprises a control unit configured to position at least a part of the sample under the beam of particles.

S12. The microscopy system according to any of the preceding system embodiments and with the features of embodiment S2, wherein the microscopy system comprises an electro-optic system configured to position the beam of particles over at least a part of the sample.

S13. The microscopy system according to the preceding embodiment and with the features of embodiment S11, wherein the control unit is configured to control the electro-optic system.

S14. The microscopy system according to any of the preceding system embodiments and with the features of embodiments S4, and S6, wherein the data processing unit is configured to communicate with the imaging system.

S15. The microscopy system according to any of the preceding system embodiments and with the features of embodiments S4, and S11, wherein the data processing unit is configured to communicate with the control unit.

S16. The microscopy system according to any of the preceding system embodiments and with the features of embodiment S4, wherein the data processing unit is configured to receive a geometry of the sample.

S17. The microscopy system according to any of the preceding system embodiments and with the features of embodiment S4, wherein the data processing unit is configured to determine a projection of at least a part, that may be called a projected part, of the sample.

S18. The microscopy system according to the preceding embodiment and with the features of embodiment S16, wherein the data processing unit is further configured to determine the projection of the projected part of the sample based on the geometry of the sample.

S19. The microscopy system according to any of the 2 preceding embodiments and with the features of embodiment S2, wherein the microscopy system comprises a source of particles and wherein the data processing unit is configured to receive a distance between the source of particles and a point in the projected part of the sample and, based thereon, to determine the projection of the projected part of the sample.

S20. The microscopy system according to any of the preceding system embodiments and with the features of embodiment S3, wherein the stage comprises a tilt axis.

S21. The microscopy system according to the preceding embodiment, wherein the microscopy system is configured to allow varying a tilt angle of the stage by rotating the sample about the tilt axis.

S22. The microscopy system according to the preceding embodiment and with the features of embodiment S16, wherein the data processing unit is configured to receive the tilt angle of the stage and, based thereon, to determine the location in three-dimensional space of the defined region.

S23. The microscopy system according to any of the preceding system embodiments and with the features of embodiment S3, wherein the sample is configured to be positioned inside the stage.

S24. The microscopy system according to the preceding embodiment, wherein positioning the sample inside the stage comprises substantially aligning an axis of the sample with the tilt axis of the stage.

S25. The microscopy system according to the preceding embodiment, wherein a result of positioning the sample inside the stage is a misalignment of the axis of the sample with the tilt axis of the stage.

S26. The microscopy system according to the preceding embodiment and with the features of embodiment S16, wherein the data processing unit is further configured to receive an angle between the axis of the sample and the tilt axis of the stage and, based thereon, to determine the location in three-dimensional space of the defined region.

S27. The microscopy system according to any of the preceding system embodiments and with the features of embodiments S13, and S15, wherein the data processing unit is configured to send data relating to the location of the defined region to the control unit.

S28. The microscopy system according to any of the preceding system embodiments, wherein the microscopy system comprises a user interface configured to at least accept an input.

S29. The microscopy system according to the preceding embodiment and with the features of embodiment S4, wherein the data processing unit is configured to communicate with the user interface.

S30. The microscopy system according to any of the preceding system embodiments and with the features of embodiment S6, wherein the part of the sample comprises a feature, and wherein the microscopy system is configured to identify the feature in the image of the part of the sample.

S31. The microscopy system according to the preceding embodiment and with the features of embodiment S4, wherein the data processing unit is configured to determine a configuration of the feature in the image of the part of the sample based on an input to the user interface.

32. The microscopy system according to any of the 2 preceding embodiments and with the features of embodiment S4, wherein the data processing unit is configured to determine a configuration of the feature in the image of the part of the sample based on an artificial intelligence-based model.

S33. The microscopy system according to the preceding embodiment, wherein the artificial intelligence-based model comprises a supervised learning model.

S34. The microscopy system according to any of the 2 preceding embodiments, wherein an input to the artificial intelligence-based model comprises an image of the part of the sample.

S35. The microscopy system according to any of the 3 preceding embodiments, wherein an output of the artificial intelligence-based model comprises the configuration of the feature in the image of the part of the sample.

S36. The microscopy system according to any of the 3 preceding embodiments, wherein the supervised learning model is trained on a dataset comprising the image of the part of the sample and the configuration of the feature.

S37. The microscopy system according to any of the preceding system embodiments and with the features of embodiments S4, and S30, wherein the data processing unit is configured to determine the configuration of the feature in the image of the part of the sample using any of edge detection, filtering, feature detection, ridge detection, or any other image processing method.

S38. The microscopy system according to any of the preceding system embodiments and with the features of embodiment S30, wherein the microscopy system is configured to determine the configuration of the feature in three-dimensional space.

S39. The microscopy system according to any of the preceding system embodiments and with the features of embodiment S4, wherein the data processing unit is configured to generate a model of at least a part, that may be called a modeled part, of the sample.

S40. The microscopy system according to any of the preceding system embodiments, wherein the microscopy system is configured to perform the method according to any of the preceding method embodiments.

Below computer program product embodiments will be discussed. These are abbreviated by the letter 'P' followed by a number. Whenever reference is herein made to computer program product embodiments, these embodiments are meant.

P1. A computer program product comprising instructions, when run on a data processing unit of a microscopy system, to perform the method according to any of the preceding method embodiments.

Embodiments of the present technology will now be discussed with reference to the accompanying figures.

For the sake of clarity, some features may only be shown in some figures, and others may be omitted. However, also the omitted features may be present, and the depicted and discussed features do not need to be present in all embodiments.

DETAILED FIGURE DESCRIPTION

Figure 1:
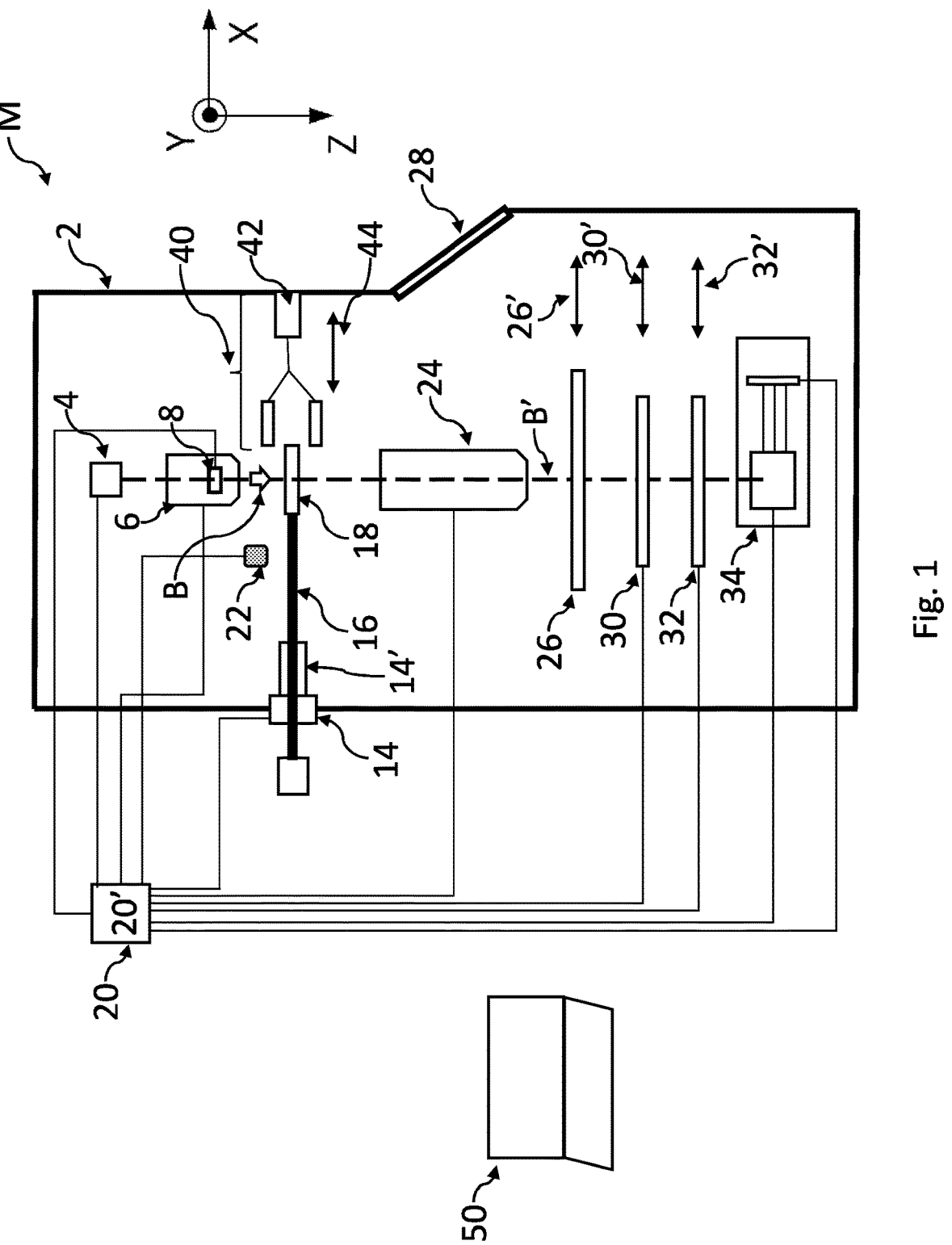
FIG. 1 depicts an exemplary microscopy system.

FIG. 1 depicts an embodiment of a microscopy system M, particularly a charged particle microscopy system M configured to use a charged particle beam B to observe and/or characterize a sample 18. The charged particle beam B may comprise electrons or ions. In the particular case depicted in FIG. 1, it comprises electrons. Additionally, the microscopy system M depicted in FIG. 1 may comprise a transmission-type microscopy system M, wherein an image of the sample 18 is taken using the emissions in the transmission region of the microscopy system M. Thus, M may represent a Transmission Electron Microscope (TEM) or a Scanning Transmission Electron Microscope (STEM). In the Figure, within a vacuum enclosure 2, an electron source 4 produces the beam B of electrons that propagates along an electron-optical axis B' and traverses an electron-optical illuminator 6, serving to direct/focus the electrons onto a chosen part of the sample 18 (which may, for example, be (locally) thinned/planarized).

Also depicted is a deflector 8, which (inter alia) can be used to effect scanning motion of the beam B. The sample 18 may be held on a sample holder 16 that can be positioned in multiple degrees of freedom by a positioning device/stage 14, which moves a cradle 14' into which holder 16 is (removably) affixed; for example, the sample holder 16 may comprise a finger that can be moved (inter alia) in the XY plane (see the depicted Cartesian coordinate system; typically, motion parallel to Z and tilt about X/Y will also be possible). Such movement allows different parts of the sample 18 to be illuminated/imaged/inspected by the electron beam B traveling along axis B' (in the Z direction) (and/or allows scanning motion to be performed, as an alternative to beam scanning). If desired, an optional cooling device (not depicted) can be brought into intimate thermal contact with the sample holder 16, so as to maintain it (and the sample 18 thereupon) at cryogenic temperatures, for example. Additionally, the positioning device/stage 14 may also effect a rotation of the sample holder 16 about an axis of rotation such that the sample 18 may be tilted and an angle between the sample 18 and the electron beam B be changed. The angle may, for example, be an angle between a normal to the sample 18 (in case the sample 18 is substantially planar), or some other direction vector that may be associated with the sample 18, and the electron beam B. The tilting of the sample 18 about the stage tilt axis may be employed to perform tomographic imaging of the sample 18 by capturing an image of the sample 18 for each tilt angle.

The electron beam B will interact with the sample 18 in such a manner as to cause various types of "stimulated" radiation to emanate from the sample 18, including (for example) secondary electrons, backscattered electrons, X-rays and optical radiation (cathodoluminescence). If desired, one or more of these radiation types can be detected with the aid of analysis device 22, which might be a combined scintillator/photomultiplier or EDX (Energy-Dispersive X-Ray Spectroscopy) module, for instance; in such a case, an image could be constructed using basically the same principle as in a Scanning Electron Microscope (SEM). However, alternatively or supplementally, one can study electrons that traverse (pass through) the sample 18, exit/emanate from it and continue to propagate (substantially, though generally with some deflection/scattering) along axis B'.

Such a transmitted electron flux enters an imaging system (projection lens) 24, which will generally comprise a variety of electrostatic/magnetic lenses, deflectors, correctors (such as stigmators), etc. In normal (non-scanning) TEM mode, this imaging system 24 can focus the transmitted electron flux onto a fluorescent screen 26, which, if desired, can be retracted/withdrawn (as schematically indicated by arrows 26') so as to get it out of the way of axis B'. An image (or diffractogram) of (part of) the sample 18 will be formed by imaging system 24 on screen 26, and this may be viewed through viewing port 28 located in a suitable part of a wall of enclosure 2. The retraction mechanism for screen 26 may, for example, be mechanical and/or electrical in nature, and is not depicted here. As an alternative to viewing an image on screen 26, one can instead make use of the fact that the depth of focus of the electron flux leaving imaging system 24 is generally quite large (e.g. of the order of 1 meter). Consequently, various other types of analysis apparatus can be used downstream of screen 26, such as a TEM camera 30. At camera 30, the electron flux can form a static image (or diffractogram) that can be processed by controller/processor 20 and displayed on a display device (not depicted), such as a flat panel display, for example. When not required, camera 30 can be retracted/withdrawn (as schematically indicated by arrows 30') so as to get it out of the way of axis B'. Note that the microscopy system M may additionally comprise a data processing unit 50 that may be configured for data processing and that may communicate with the controller 20 to effect a deflection of the beam B, for example. In other words, the data processing unit 50 may, among other things, send data relating to a location of a defined region of the sample 18 to be illuminated to the controller 20, based on which the controller may then appropriately deflect the electron beam B. Alternatively, if the stage 14 has an appropriate precision, the controller 20 may be configured to place the defined region of the sample 18 under the beam B. Similarly, the controller 20 may also be configured to position the imaging system 24 such that the defined region of the sample 18 can be brought into focus.

The analysis apparatus may further comprise a STEM camera 32. An output from camera 32 can be recorded as a function of (X,Y) scanning position of the beam B on the sample 18, and an image can be constructed that is a "map" of output from camera 32 as a function of X,Y. Camera 32 can comprise a single pixel with a diameter of e.g. 20 mm, as opposed to the matrix of pixels characteristically present in camera 30. Moreover, camera 32 will generally have a much higher acquisition rate (e.g., $10^6$ points per second) than camera 30 (e.g., $10^2$ images per second). Once again, when not required, camera 32 can be retracted/withdrawn (as schematically indicated by arrows 32') so as to get it out of the way of axis B' (although such retraction would not be a necessity in the case of a donut-shaped annular dark field camera 32, for example; in such a camera, a central hole would allow flux passage when the camera was not in use).

As an alternative to imaging using cameras 30 or 32, one can also invoke spectroscopic apparatus 34, which could be an electron energy loss spectrometry (EELS) module, for example. It should be noted that the order/location of items 30, 32 and 34 is not strict, and many possible variations are conceivable. For example, spectroscopic apparatus 34 can also be integrated into the imaging system 24. Note that the controller (computer processor) 20 is connected to various illustrated components via control lines (buses) 20'. This controller 20 can provide a variety of functions, such as synchronizing actions, providing setpoints, processing signals, performing calculations, and displaying messages/information on a display device (not depicted). Needless to say, the (schematically depicted) controller 20 may be (partially) inside or outside the enclosure 2, and may have a unitary or composite structure, as desired. The skilled artisan will understand that the interior of the enclosure 2 does not have to be kept at a strict vacuum; for example, in a so-called "Environmental TEM/STEM", a background atmosphere of a given gas is deliberately introduced/maintained within the enclosure 2. The skilled artisan will also understand that, in practice, it may be advantageous to confine the volume of enclosure 2 so that, where possible, it essentially hugs the axis B', taking the form of a small tube (e.g., of the order of 1 cm in diameter) through which the employed electron beam passes, but widening out to accommodate structures such as the source 4, sample holder 16, screen 26, camera 30, camera 32, spectroscopic apparatus 34, etc.

The microscope M may further comprise a retractable X-ray CT module 40, which can be advanced/withdrawn with the aid of positioning system 42 so as to place it on/remove it from the path of the beam B (see arrow 44). In the particular configuration illustrated here, the module 40 comprises a fork-like frame on which are mounted—a target above the plane of the sample 18, and an X-ray detector below the plane of the sample 18.

As described above, when the microscopy system M is employed to carry out tomographic imaging of a sample 18, the sample 18 is tilted about an axis by means of the stage 14. Then, the beam B is directed onto the sample 18, and a resulting image captured by the imaging system 24. The tilt angle of the stage 14, and thus of the sample 18, is varied and an image is captured at each of the tilt angles. Misalignment of the sample 18 with the stage 14 (that may comprise, for example, a misalignment of an axis of the sample 18 with the tilt axis of the stage 14) or imperfections in the fabrication process of the sample 18 may cause a precession of features in images of the sample 18 at the different tilt angles. For example, the sample 18 may comprise a significantly rod-like sample and it may be desired to perform a tomographic analysis of the sample 18 along the direction of the rod. Then, the sample 18 may be tilted and images of the sample 18 be captured. However, the axis of the rod may not be aligned accurately with the axis of the stage 14 so that a precession of the rod may be seen in images of the sample 18. Alternatively, the sample 18 may comprise a substantially planar sample that may be tilted with respect to a plane of the sample holder 16. The planes of the sample 18 and the sample holder 16 may also be misaligned leading to a precession of the image of the plane of the sample 18.

Figure 2:
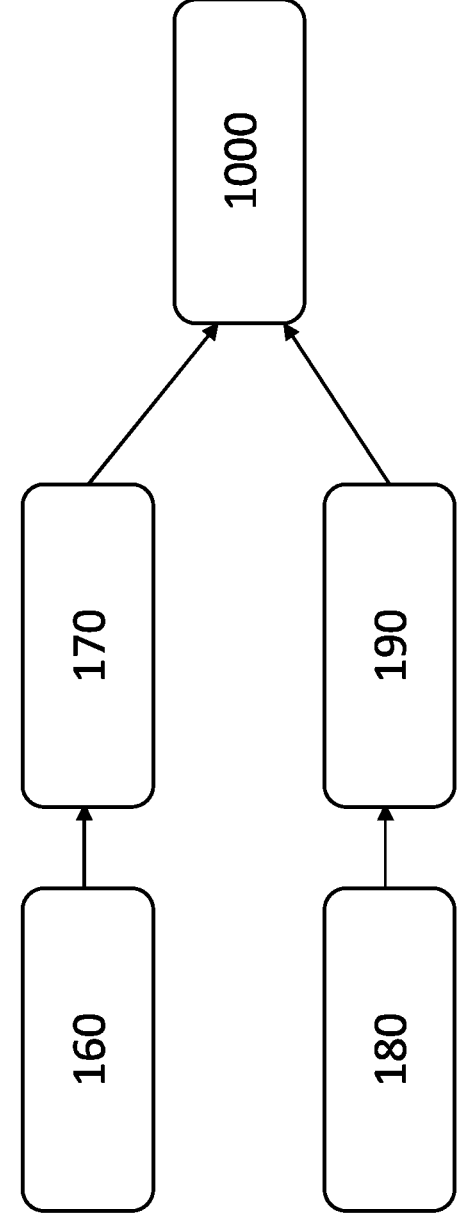
FIG. 2 depicts an exemplary embodiment of the method according to the present technology.

Embodiments of the present technology are directed, in a first instance, to a method for accounting for this precession. An exemplary embodiment is depicted in FIG. 2. The exemplary embodiment comprises a plurality of steps that may be of advantage in accounting for precession in images and may thus allow for faster acquisition of tomographic images.

The sample 18 may comprise a defined region corresponding to a region of interest, or the tracked feature as described above. The defined region may comprise any of an exposure region, a focusing region, or a tracking region. The microscopy system M may be configured, for example, for imaging the defined region. Owing to the misalignment of the sample 18, or imperfections in the fabrication process of the sample 18, as described above, the precise location of the defined region in three-dimensional space may be unknown. For example, the sample 18 may comprise a rod-like section that may have a length of 200 nm, and the defined region may comprise a length of 10 nm around the center of the rod-like section. Owing to misalignment of the sample 18 within the stage 14 (where, in the following, "within the stage" should be understood to comprise within the sample holder 16 that is controlled with the stage 14), the precise location in three-dimensional space of the rod-like section may not be known, even if the precise location of the sample holder 16 and the stage 14 is known. As may be appreciated, the resolution of the microscopy system M may be in the hundreds of pm, so that a precise determination of the location of the defined region may be of advantage. The step of determining the location in three-dimensional space of the defined region may comprise a "determination step" 1000 in embodiments of the present technology.

The determination step 1000 may be carried out by the data processing unit 50. The data processing unit 50 may be configured to accept an input. The input to the data processing unit 50 may be based on an image of a part of the sample 18. Capturing the image of the part of the sample 18 may comprise a step 180, that may be called an imaging step, in embodiments of the present technology. The part of the sample 18 that is imaged may or may not comprise the defined region. Preferably, the part of the sample 18 comprises the defined region. The part of the sample 18 may also comprise the whole sample 18. In other words, the whole sample 18 may be imaged and the location in three-dimensional space of the defined region may be determined based on the image of the whole sample 18.

The image of the part of the sample 18 may be obtained at a first magnification. Magnification may be understood to be in inverse relation to a diameter of the beam B at the part of the sample 18. Thus, for example, illuminating the whole sample 18 may comprise a magnification that is lower than when illuminating less than the whole of the sample 18.

The sample 18 may comprise a feature. The feature may or may not be comprised in the part of the sample 18 that is imaged as described above. The feature may comprise a zero extension, such as a point, or it may comprise a feature with a non-zero extension, such as an edge. For example, the sample 18 may comprise a rod-like section and the feature may comprise, for example, a position on the rod-like section. Or, the sample 18 may comprise a significantly planar section and the feature may comprise an edge of the planar section. Further, the feature may comprise a position in the sample 18 on which the image of the part of the sample 18 may be centered (in which case the feature may also be said to be comprised in the part of the sample 18).

The method according to embodiments of the present technology may comprise a step 160, that may be called a projection step, to determine a configuration in three-dimensional space of the feature on the sample 18. The terms "configuration" and "relative configuration" here and in the following are intended to comprise position and/or orientation with respect to some co-ordinate system that comprises an origin. That is, in particular, they may comprise either position or orientation or both. As may be appreciated, depending on the feature only one of the above may apply. For example, for a point-like feature the configuration may comprise only a position, whereas for a vector or an edge it may comprise any of a position (defined by the co-ordinates of a point through which the edge or the vector passes, for example) or an orientation (defined by the direction cosines of the edge or the vector, for example). Note also that the configuration of any of the features may not have to be determined precisely. Embodiments of the present technology relate to a relative configuration of features. This relative configuration may be precise so long as the individual configuration of each of the features is offset by the same amount. It may also be understood that for determining relative configurations, individual configurations may have to be determined with reference to the same origin and co-ordinate system. Or, in case the configurations are determined with reference to different origins or co-ordinate systems, the relative configuration of the origins and the co-ordinate systems is precisely determined.

For example, the feature may comprise a position on the rod-like section of the sample 18 and determining the configuration in three-dimensional space of the feature may comprise determining co-ordinates of the position with respect to some co-ordinate system. Or, if the feature on the sample 18 comprises an edge, determining the configuration of the feature in three-dimensional space may comprise determining any of the configuration of a point through which the edge passes or the direction cosines of the edge (with respect to some co-ordinate system).

The sample 18 may comprise a plurality of features. Any of the plurality of features may or may not be comprised in the part of the sample 18 that is imaged in step 180. In particular, the sample 18 may comprise a first feature and a second feature. The projection step 160 may then comprise determining a relative configuration of the first feature and the second feature in three-dimensional space. In other words, the configuration in three-dimensional space of the first feature relative to the configuration in three-dimensional space of the second feature may be determined. In particular, the relative configuration may be described by the distance and/or direction in three-dimensional space of the first feature relative to the second feature. The order of the features in determining the relative configuration may not be relevant.

Further, in the projection step 160, the microscopy system M, preferably the data processing unit 50, may be configured to determine a projection of the first feature and the second feature of the sample 18, based on their configurations in three-dimensional space, onto the same plane as the plane of the image, that may be called an image plane, captured in the imaging step 180. The projections of the first feature and the second feature may lie in a projection space. Step 170, that may be called a spatial configuration step, may further comprise determining a relative configuration in the projection space of the first feature and the second feature. The projection of any of the features may be further based on the relative position between the feature and the imaging beam B of the microscopy system M. It may also be based on a magnification of the beam B or any other appropriate input that may be used to determine the relative configuration of the first feature and the second feature in projection space.

The part of the sample 18 that is imaged in the imaging step 180 may also comprise a feature, or a plurality of features. In particular, it may comprise a first feature and a second feature. Note that any of the first feature and the second feature in the part of the sample 18 (that are imaged) may or may not be identical to any of the first feature and the second feature in the sample 18 (that are projected on to the projection plane) as described above. A further step 190, that may be called an image configuration step, may comprise determining the relative configuration in a pixel space of the image of the first feature and the second feature. That is, in image configuration step 190, the distance and/or direction in the image of the first feature relative to the second feature may be determined. This may comprise, for example, determining the position (in pixels) of the first feature and the second feature, in case each of the two features comprises a point-like feature.

The relative configuration in projection space of the first feature and the second feature of the sample 18, and the relative configuration in pixel space of the first feature and the second feature in the part of the sample 18 (that is imaged) may then be used in determination step 1000 to determine the location in three-dimensional space of the defined region. In other words, embodiments of the present technology aim to correct for precession of the tracked feature (that may correspond to the defined region) by accurately determining the three-dimensional location of the tracked feature. This location may be determined by comparing the projection on to an image plane of a three-dimensional vector to a captured image of a three-dimensional vector. The relative configuration of the vector that is imaged to the vector that is projected may be precisely determined such that a comparison may be made. Preferably, the vector that is imaged may be substantially parallel to the vector that is projected.

Based on the determined location of the defined region, the beam B may be moved over the defined region for illumination. Or the imaging system 24 may be focused on to the defined region based on, for example, the height of the defined region. Or, the sample 18 may be moved by means of the stage 14 such that the defined region may be brought in to focus and/or under the imaging beam B. Note that to move the sample 18 under the beam B the stage 14 may be required to have a high precision (since the expected correction may be, for example, in tens of nm).

Figure 3:
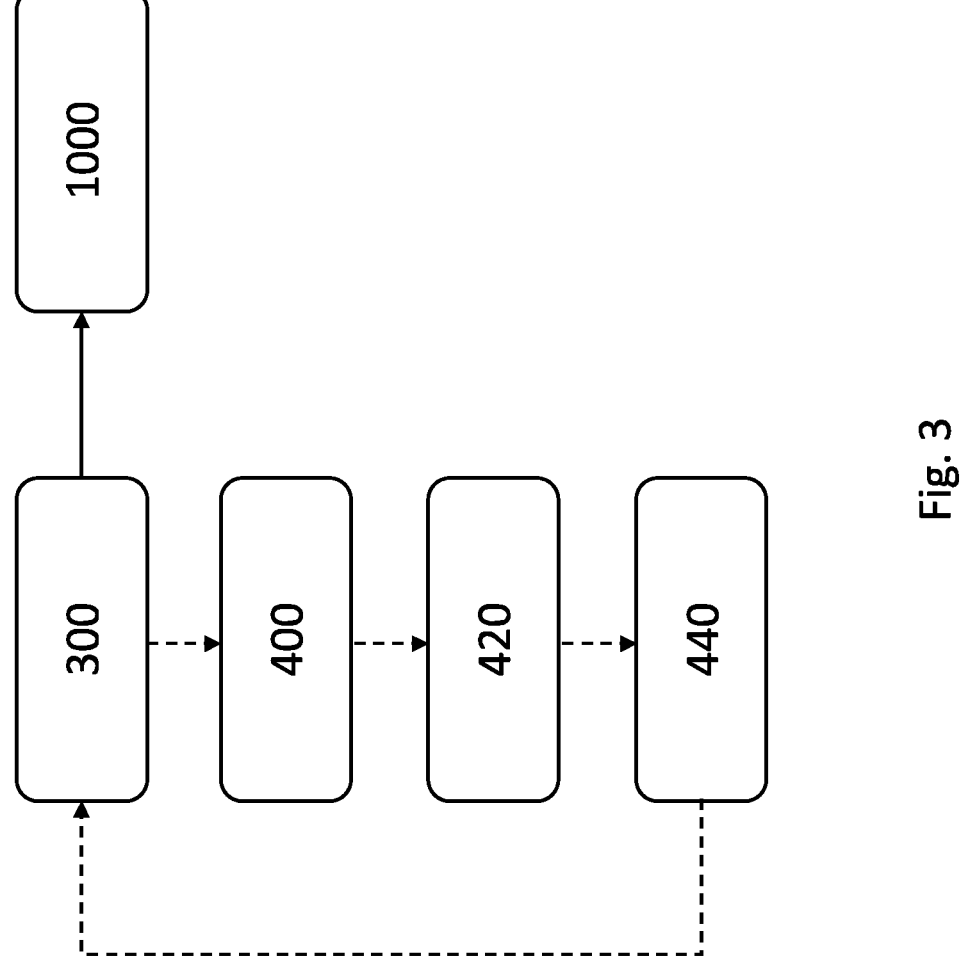
FIG. 3 depicts yet another exemplary embodiment of the method according to the present technology.

FIG. 3 depicts another exemplary embodiment of the method according to the present technology. Here, the method comprises the determination step 1000 and a further model generation step 300, wherein a model of at least a part the sample 18 is generated. The part of the sample 18 may be called a modeled part of the sample 18. The model of the modeled part may be generated digitally by the data processing unit 50, for example. The model may be based on a geometry of the sample 18 and may comprise a representation of at least some features of the modeled part of sample 18 along with their relative positions and/or orientations on the modeled part of sample 18. The model of the modeled part of sample 18 may also be used to determine the location in three-dimensional space of the defined region in determination step 1000.

As further depicted in FIG. 3, the method may comprise a step 400, wherein a projection of at least a part of the sample 18, that may be called a projected part, may be determined. The projection may be determined using the model of the modeled part of the sample 18 (depicted using the dashed arrow). The modeled part and the projected part may or may not be identical parts of the sample 18. Based on the modeled part, together with the geometry and other characteristics (rigidity, for example) of the sample 18, for example, it may be possible to determine the projection of the projected part (that may be different from the modeled part). In particular, it may thus not be necessary to generate a model for the whole sample 18.

In a further step 420, an image of the projected part of the sample 18 is captured. The projection and the image of the projected part of the sample 18 may then be compared to each other in a step 440. Based on this comparison, the model of the modeled part of sample 18 may be refined. The modeled part and/or the projected part of the sample 18 may comprise the whole sample 18 or any fraction of the sample 18. This embodiment may thus comprise determining the location in three-dimensional space of the defined region based on a model of at least a part of the sample 18. It may further comprise determining a projection and capturing an image of a projected part of the sample 18 and refining the model based on feedback from the image and the projection of the projected part.

The feedback from images may be of particular advantage in refining the model of the modeled part of the sample 18. For example, the sample 18 may comprise a plane with a slight curvature and the method may comprise generating a model for the whole sample 18. An initial model may then approximate the sample 18 as a flat plane. After imaging the sample 18, for example, two features in the image of the sample 18 may appear at a different distance than in the projection of the sample 18 calculated based on the initial flat model of the sample 18. This data may be used to update the model of the sample 18 leading to a more reliable model based on which, for example, the location in three-dimensional space of the defined region may be determined.

Figure 4:
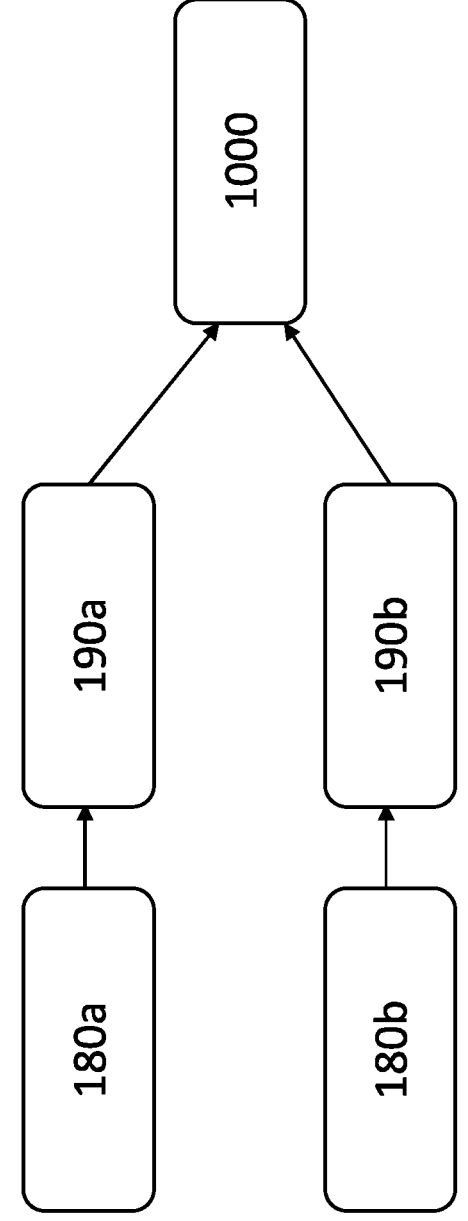
FIG. 4 depicts a further exemplary embodiment of the method according to the present technology.

FIG. 4 depicts another exemplary embodiment of the method according to the present technology. As before, the method comprises the determination step 1000 to determine the location in three-dimensional space of a defined region of the sample 18. The method also comprises the step 180 of capturing an image of at least a part of the sample 18. However, in the embodiment depicted in FIG. 4, the step 180 is divided into a plurality of steps, such as two steps 180a, and 180b. Each of the plurality of steps 180 comprises capturing an image of at least a part of the sample 18, but each at a different orientation of the sample 18. For example, FIG. 4 depicts capturing the image of the part of the sample 18 at two different orientations. Each of the orientations may be determined by using, for example, parameters that may describe the three-dimensional orientation of a rigid body such as Euler angles, Tait-Bryan angles, and others with respect to a co-ordinate system.

In case of the microscopy system M, orientation may be defined using the stage 14. As described above, the stage 14 may comprise a tilt axis, that may also be called a stage tilt axis, and the sample 18 may be positioned within the sample holder 16 such that an axis of the sample 18 is aligned with the stage tilt axis. By tilting the sample 18 along the stage tilt axis, a tilt angle, and thus orientation, of the sample 18 may be varied. Images of the sample 18 may be captured at each tilt angle to perform a tomographic acquisition. However, as described above, misalignment of the sample 18 (that may be understood to comprise misalignment of the axis of the sample 18 with the stage tilt axis) may result in a precession of the tracked feature (or the defined region).

FIG. 4 depicts step 180a comprising capturing the image of the part of the sample 18 at the first sample orientation comprising a first tilt angle, and step 180b comprising capturing the image of the part of the sample 18 at the second sample orientation comprising a second tilt angle. A difference between the first tilt angle and the second tilt angle may be greater than 0° and less than or equal to 90°, preferably between 10° and 80°, further preferably between 30° and 60°. Each of the first tilt angle, and the second tilt angle, may be between −180° and +180°, preferably between −90° and +90°, further preferably between −70° and +70°

For each of the plurality of steps 180, a step 190 may be carried out as described above. That is, in step 190a, the relative configuration in pixel space of a first feature and a second feature in the image of the part of the sample 18 captured at the first tilt angle may be determined. Similarly, in step 190b, the relative configuration in pixel space of a first feature and a second feature in the image of the part of the sample 18 captured at the second tilt angle may be determined. Note that any of the first feature and the second feature used in step 190a may or may not be identical to any of the first feature and the second feature used in step 190b. Based on the relative configuration of the first feature and the second feature determined in step 190a, and on the relative configuration of the first feature and the second feature determined in step 190b, the location in three-dimensional space of the defined region may be determined in determination step 1000. The results of steps 190a and 190b may also be used to refine the model of the modeled part of the sample 18 as described above. In other words, this embodiment may correspond to a stereographic analysis of images of at least a part of the sample 18 to determine the location in three-dimensional space of the defined region.

As may be appreciated, the use of images of the sample 18 at two tilt angles to determine the location in three-dimensional space of the defined region is merely exemplary, and any number of images of the sample 18 at different tilt angles may be used. The actual number of images used may depend on prior information about any of the geometry of the sample 18, the positioning of the sample 18 within the sample holder 16, fabrication characteristics of the sample 18, and any other suitable factors. The number of images of the sample 18 used may be lesser, for example, if more prior information about the configuration of the microscopy system M, and the geometry and configuration of the sample 18 is available. For example, in the case of a planar sample that may be fabricated with a specific geometry, only one image of the sample 18 at the first tilt angle may be sufficient to determine the location in three-dimensional space of the defined region if the known geometry of the sample 18 is used.

The sample 18 may further comprise a plurality of defined regions, and the method may comprise determining the location in three-dimensional space of each of the defined regions. The method may also comprise determining the location in three-dimensional space of one of the plurality of defined regions based on the location in three-dimensional space of another one of the plurality of defined regions.

The defined region of the sample 18 may comprise an exposure region, configured to be imaged at an imaging magnification. The imaging magnification may be at least equal to the first magnification at which the image in step 180 is taken. Preferably, the imaging magnification may be greater than the first magnification. Thus, for example, the image captured in step 180 may be a low magnification image using which the location in three-dimensional space of the exposure region may be determined. The exposure region may be sensitive to the dose of radiation from the beam B. For example, it may be a cryogenic sample. Thus, it may be advantageous to not irradiate it with a high dose of radiation to determine its location. Embodiments of the present technology may allow determination of the location of the exposure region using only a low magnification image of at least a part of the sample 18 (that may also, for example, not be sensitive to the dose of radiation) followed by a further higher magnification imaging of the sample for analysis. Once the location in three-dimensional space of the exposure region has been determined, the beam B may be positioned over the exposure region (the imaging system 24 may be configured to move along with the beam B), or the exposure region may be moved under the beam B (if, for example, the stage 14 has an appropriate precision) and imaging of the exposure region may be carried out.

The defined region of the sample 18 may also comprise a focusing region, configured such that the imaging system 24 may be focused on to it. As before, the precise location in three-dimensional space of the focusing region as determined using embodiments of the present technology may be advantageous in allowing focusing on to the focusing region. The defined region of the sample 18 may also comprise a tracking region, configured to be imaged at a tracking magnification. The tracking magnification may be at least equal to, preferably greater than, the first magnification at which the image in step 180 is captured.

Overall, embodiments of the present technology thus aim to provide a method for acquiring tomographic images of a sample in a microscopy system that is more efficient, robust, and may allow for a higher throughput by reducing the degradation of dose-sensitive samples.

Whenever a relative term, such as "about", "substantially" or "approximately" is used in this specification, such a term should also be construed to also include the exact term. That is, e.g., "substantially straight" should be construed to also include "(exactly) straight".

Whenever steps were recited in the above or also in the appended claims, it should be noted that the order in which the steps are recited in this text may be accidental. That is, unless otherwise specified or unless clear to the skilled person, the order in which steps are recited may be accidental. That is, when the present document states, e.g., that a method comprises steps (A) and (B), this does not necessarily mean that step (A) precedes step (B), but it is also possible that step (A) is performed (at least partly) simultaneously with step (B) or that step (B) precedes step (A). Furthermore, when a step (X) is said to precede another step (Z), this does not imply that there is no step between steps (X) and (Z). That is, step (X) preceding step (Z) encompasses the situation that step (X) is performed directly before step (Z), but also the situation that (X) is performed before one or more steps (Y1), . . . , followed by step (Z). Corresponding considerations apply when terms like "after" or "before" are used.

While in the above, a preferred embodiment has been described with reference to the accompanying drawings, the skilled person will understand that this embodiment was provided for illustrative purpose only and should by no means be construed to limit the scope of the present invention, which is defined by the claims.

The invention claimed is:

1. A method for acquiring tomographic images of a sample in a microscopy system, wherein the sample comprises a defined region including an exposure region having features that are of interest for imaging, and wherein the method comprises:

capturing an image of at least a part of the sample; and determining a location in three-dimensional space of the defined region by:

determining a first configuration, in a projection space, of a first feature of the sample in three-dimensional space relative to a configuration of a second feature of the sample in three-dimensional space, determining a second configuration of a third feature in the part of the sample in three-dimensional space relative to a configuration of a fourth feature in the part of the sample in three-dimensional space, comparing the relative configuration of the third feature and the fourth feature in the image of the part of sample to the relative configuration of the first feature and the second feature in the projection space to determine an angle between an axis of the sample and a tilt axis of a stage on which the sample is positioned, and determining the location in three-dimensional space of the defined region based, at least in part, on the comparison of the relative configuration of the third feature and the fourth feature in the image of the part of the sample to the relative configuration of the first feature and the second feature in the projection space and the determination of the angle between the axis of the sample and the tilt axis of the stage; and positioning a beam of particles over the exposure region based on the determined location in three-dimensional space of the exposure region.

2. The method of claim 1, wherein the method further comprises generating a model of at least a modeled part of the sample, and wherein the determination of the location in three-dimensional space of the defined region is based, at least in part, on the model.

3. The method of claim 2, wherein the method comprises determining a projection of at least a projected part of the sample, wherein the projection is based, at least in part, on the model;

capturing an image of the projected part of the sample;

comparing the image and the projection of the projected part of the sample; and refining the model based on the comparison between the image and the projection of the projected part of the sample.

4. The method of claim 2, wherein the method comprises capturing images at a plurality of sample orientations, and wherein the image of the part of the sample comprises the image of the part of the sample at a first sample orientation.

5. The method of claim 4, wherein the method comprises capturing an image of at least the part of the sample at a second sample orientation, wherein the second sample orientation is not identical to the first sample orientation.

6. The method of claim 5, wherein the determination of the location in three-dimensional space of the defined region is based, at least in part, on a relative configuration of the third feature and the fourth feature in the image of the part of the sample at the first sample orientation and on a relative configuration of the third feature and the fourth feature in the image of the part of the sample at the second sample orientation.

7. A microscopy system configured for acquiring tomographic images of a sample, wherein the microscopy system is configured to perform the method of claim 1.

8. The microscopy system of claim 7, further comprising an imaging system configured to capture the image of the part of the sample, wherein the part of the sample comprises a feature, and wherein the microscopy system is configured to identify the feature in the image of the part of the sample, wherein the microscopy system comprises a data processing unit, wherein the data processing unit is configured to determine a configuration of the feature in the image of the part of the sample based on an artificial intelligence-based model.

9. The microscopy system of claim 8, wherein the artificial intelligence-based model comprises a supervised learning model.

10. The microscopy system of claim 7, further comprising an imaging system configured to capture the image of the part of the sample, wherein the part of the sample comprises a feature, and wherein the microscopy system is configured to identify the feature in the image of the part of the sample, wherein the microscopy system comprises a data processing unit, wherein the data processing unit is configured to determine the configuration of the feature in the image of the part of the sample using any of edge detection, filtering, feature detection, ridge detection, or any other image processing method.

11. The method of claim 1, wherein the microscopy system comprises the stage including the stage tilt axis and configured to position and/or orient the sample, and wherein the method comprises rotating the sample about the stage tilt axis to vary a tilt angle of the stage and change an orientation of the sample.

12. The method of claim 11, wherein the determination of the location in three-dimensional space of the defined region is based, at least in part, on the tilt angle of the stage.

13. A computer program product comprising a non-transitory computer-readable medium storing instructions that, when run on a data processing unit of a microscopy system, perform a method of:

capturing an image of at least a part of a sample, the sample having a defined region including an exposure region having features that are of interest for imaging, determining a location in three-dimensional space of the defined region of the sample by:

determining a first configuration, in a projection space, of a first feature of the sample in three-dimensional space relative to a configuration of a second feature of the sample in three-dimensional space, determining a second configuration of a third feature in the part of the sample in three-dimensional space relative to a configuration of a fourth feature in the part of the sample in three-dimensional space, comparing the relative configuration of the third feature and the fourth feature in the image of the part of sample to the relative configuration of the first feature and the second feature in the projection space to determine an angle between an axis of the sample and a tilt axis of a stage on which the sample is positioned, and determining the location in three-dimensional space of the defined region based, at least in part, on the comparison of the relative configuration of the third feature and the fourth feature in the image of the part of the sample to the relative configuration of the first feature and the second feature in the projection space and the determination of the angle between the axis of the sample and the tilt axis of the stage; and positioning a beam of particles over the exposure region based on the determined location in three-dimensional space of the exposure region.

14. The computer program product of claim 13, wherein the method further comprises generating a model of at least a modeled part of the sample, and wherein the determination of the location in three-dimensional space of the defined region is based, at least in part, on the model.

15. The computer program product of claim 14, wherein the method comprises determining a projection of at least a projected part of the sample, wherein the projection is based, at least in part, on the model;

capturing an image of the projected part of the sample;

comparing the image and the projection of the projected part of the sample; and refining the model based on the comparison between the image and the projection of the projected part of the sample.

16. The computer program product of claim 14, wherein the method comprises capturing images at a plurality of sample orientations, and wherein the image of the part of the sample comprises the image of the part of the sample at a first sample orientation.

\* \* \* \* \*